(12) United States Patent
Tao et al.

(10) Patent No.: US 10,749,017 B1
(45) Date of Patent: Aug. 18, 2020

(54) HETEROJUNCTION BIPOLAR TRANSISTORS WITH FIELD PLATES

(71) Applicant: QUALCOMM Incorporated, San Diego, CA (US)

(72) Inventors: Gengming Tao, San Diego, CA (US); Bin Yang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/274,094

(22) Filed: Feb. 12, 2019

(51) Int. Cl.
*H01L 29/737* (2006.01)
*H01L 29/08* (2006.01)
*H01L 29/205* (2006.01)
*H01L 29/40* (2006.01)
*H01L 29/66* (2006.01)
*H01L 29/10* (2006.01)

(52) U.S. Cl.
CPC ...... *H01L 29/7371* (2013.01); *H01L 29/0817* (2013.01); *H01L 29/0821* (2013.01); *H01L 29/1004* (2013.01); *H01L 29/205* (2013.01); *H01L 29/402* (2013.01); *H01L 29/66318* (2013.01)

(58) Field of Classification Search
CPC ............. H01L 29/0817; H01L 29/0821; H01L 29/1004; H01L 29/205; H01L 29/402; H01L 29/66318; H01L 29/7371
See application file for complete search history.

(56) References Cited

U.S. PATENT DOCUMENTS

| 8,748,238 B2 | 6/2014 | Liu et al. |
| 9,111,987 B2 | 8/2015 | Gridelet et al. |
| 9,324,846 B1 | 4/2016 | Camillo-Castillo et al. |
| 9,905,679 B2 | 2/2018 | Magnee et al. |
| 2004/0016941 A1 | 1/2004 | Yanagisawa et al. |
| 2015/0060885 A1* | 3/2015 | Suzuki .............. H01L 21/02376 257/77 |
| 2017/0062595 A1 | 3/2017 | Dungan et al. |
| 2017/0229564 A1 | 8/2017 | Donkers et al. |
| 2017/0345899 A1* | 11/2017 | Suzuki .................. H01L 29/402 |

(Continued)

FOREIGN PATENT DOCUMENTS

| CN | 102522425 B | 4/2014 |
| JP | 2005051111 A | 2/2005 |

OTHER PUBLICATIONS

International Search Report and Written Opinion—PCT/US2019/064816—ISA/EPO—dated Mar. 16, 2020.

(Continued)

*Primary Examiner* — Allan R Wilson
(74) *Attorney, Agent, or Firm* — MG-IP Law, P.C.

(57) ABSTRACT

Power amplifiers in radio frequency circuits are typically implemented as heterojunction bipolar transistors. In applications such as in 5G systems, the circuits are expected to operate at very high speeds, e.g., up to 100 GHz. Also, a certain amount of output power should be maintained for stable operation. To achieve both high power and high speed, it is proposed to incorporate field plates in the heterojunction bipolar transistors to reduce electric field in the collector. This allows the breakdown voltage of the transistor to be high, which aids in power output. At the same time, the collector can be relatively thin, which aids in operation speed.

25 Claims, 6 Drawing Sheets

(56) References Cited

U.S. PATENT DOCUMENTS

2019/0305094 A1* 10/2019 Tao .................. H01L 29/205
2019/0386154 A1* 12/2019 Tao .................. H01L 29/0657

OTHER PUBLICATIONS

Dynamic Improvement for Nitride Semiconductor Power Switching, Apr. 13, 2011, Retrieved from the Internet: http://www.semiconductor-today.com/news_items/2011/APRIL/HRL_130411.html>, 2 pages.

Palankovski V., et al., "Field-Plate Optimization of AlGaN/GaN HEMTs," IEEE Compound Semiconductor Integrated Circuit Symposium, 2006, pp. 107-110.

Raj G., et al., "Polarization and Breakdown Analysis of AlGaN Channel HEMTs with AlN Buffer," World Journal of Condensed Matter Physics, Aug. 2015, vol. 05, No. 03, Article ID: 58950, 11 Pages, 10.4236/wjcmp.2015.53024.

Wurfl J., et al., "Techniques towards GaN Power Transistors with Improved High Voltage Dynamic Switching Properties," IEEE International Electron Devices Meeting, 2013, pp. IEDM13-144-IEDM13-147.

* cited by examiner

HETEROJUNCTION BIPOLAR TRANSISTORS WITH FIELD PLATES

FIELD OF DISCLOSURE

One or more aspects of the present disclosure generally relate to transistors, and in particular, to heterojunction bipolar transistors with high power and high speed.

BACKGROUND

Power amplifiers (PA) in radio frequency (RF) circuits are typically implemented in heterojunction bipolar transistors (HBTs). Normally, there is a tradeoff between PAs having high power and PAs having high speed. For example, increasing the power of an HBT typically coincides with decreasing the operational speed of the same HBT and vice versa.

But in applications such as in 5G systems, the devices are expected to operate at very high speeds, e.g., up to 100 GHz. Also, a certain amount of output power should be maintained for stable operation. Therefore, it would be desirable to implement power amplifiers that operate at both high power and high speed.

SUMMARY

This summary identifies features of some example aspects, and is not an exclusive or exhaustive description of the disclosed subject matter. Whether features or aspects are included in, or omitted from this summary is not intended as indicative of relative importance of such features. Additional features and aspects are described, and will become apparent to persons skilled in the art upon reading the following detailed description and viewing the drawings that form a part thereof.

An exemplary heterojunction bipolar transistor is disclosed. The heterojunction bipolar transistor may comprise a collector, a base, and an emitter. The base may be in contact with an upper surface of the collector, and the emitter may be in contact with an upper surface of the base. The heterojunction bipolar transistor may also comprise one or more passivation layers on one or more mesa surfaces. Each mesa surface may be defined by side surfaces of the collector and the base on a same side from the upper surface of the base to a lower surface of the collector. The heterojunction bipolar transistor may further comprise one or more field plates on the one or more passivation layers such that each passivation layer is in between a corresponding mesa surface and a corresponding field plate. Each field plate may be electrically coupled to one of the emitter or the base. Also, each mesa surface may be sloped such that there is a non-zero deviation angle between that mesa surface and a direction normal to a plane defined by the lower surface of the collector.

An exemplary method to form a heterojunction bipolar transistor is disclosed. The method may comprise forming a collector, forming a base, and forming an emitter. The base may be formed in contact with an upper surface of the collector, and the emitter may be formed in contact with an upper surface of the base. The method may also comprise forming one or more passivation layers on one or more mesa surfaces. Each mesa surface may be defined by side surfaces of the collector and the base on a same side from the upper surface of the base to a lower surface of the collector. The method may further comprise forming one or more field plates on the one or more passivation layers such that each passivation layer is in between a corresponding mesa surface and a corresponding field plate. Each field plate may be formed to electrically couple to one of the emitter or the base. Also, each mesa surface may be sloped such that there is a non-zero deviation angle between that mesa surface and a direction normal to a plane defined by the lower surface of the collector.

Another exemplary heterojunction bipolar transistor is disclosed. The heterojunction bipolar transistor may comprise a collector, a base, and an emitter. The base may be in contact with an upper surface of the collector, and the emitter may be in contact with an upper surface of the base. The heterojunction bipolar transistor may also comprise one or more passivation layers on one or more mesa surfaces. Each mesa surface may be defined by side surfaces of the collector and the base on a same side from the upper surface of the base to a lower surface of the collector. The heterojunction bipolar transistor may further comprise one or more means for attenuating electric field on the one or more passivation layers such that each passivation layer is in between a corresponding mesa surface and a corresponding means for attenuating electric field. Each means for attenuating electric field may be electrically coupled to one of the emitter or the base. Also, each mesa surface may be sloped such that there is a non-zero deviation angle between that mesa surface and a direction normal to a plane defined by the lower surface of the collector.

BRIEF DESCRIPTION OF THE DRAWINGS

The accompanying drawings are presented to aid in the description of examples of one or more aspects of the disclosed subject matter and are provided solely for illustration of the examples and not limitation thereof.

DETAILED DESCRIPTION

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

Recall from above that one disadvantage (of which there can be several) of conventional power amplifiers (PA), such as transistors used in radio frequency (RF) circuits, is that it is difficult to achieve both high power and high speed since these are usually tradeoff characteristics, i.e., an increase in one usually coincides with a decrease in the other. Johnson's figure of merit (JFM), which may be viewed as a measure of suitability of a semiconductor material for high frequency power transistor applications, is important in evaluating RF transistors.

JFM is a product of a breakdown voltage and a speed of the RF transistor, and may be expressed quantitatively in equation (1):

$$JFM = Vb \times Ft = Vb/2\pi\tau \qquad (1)$$

In equation (1), Vb represents the breakdown voltage, Ft represents the cutoff frequency, and τ represents the carrier transient time through the transistor. Improving the JFM of power transistors can be important. For example, a 5G system typically requires operating at much higher frequency than 4G, e.g., mmWave up to 100 GHz, while achieving a certain high output power. In other words, PA transistors should have both high Vb and high Ft at the same time.

Figure 1:
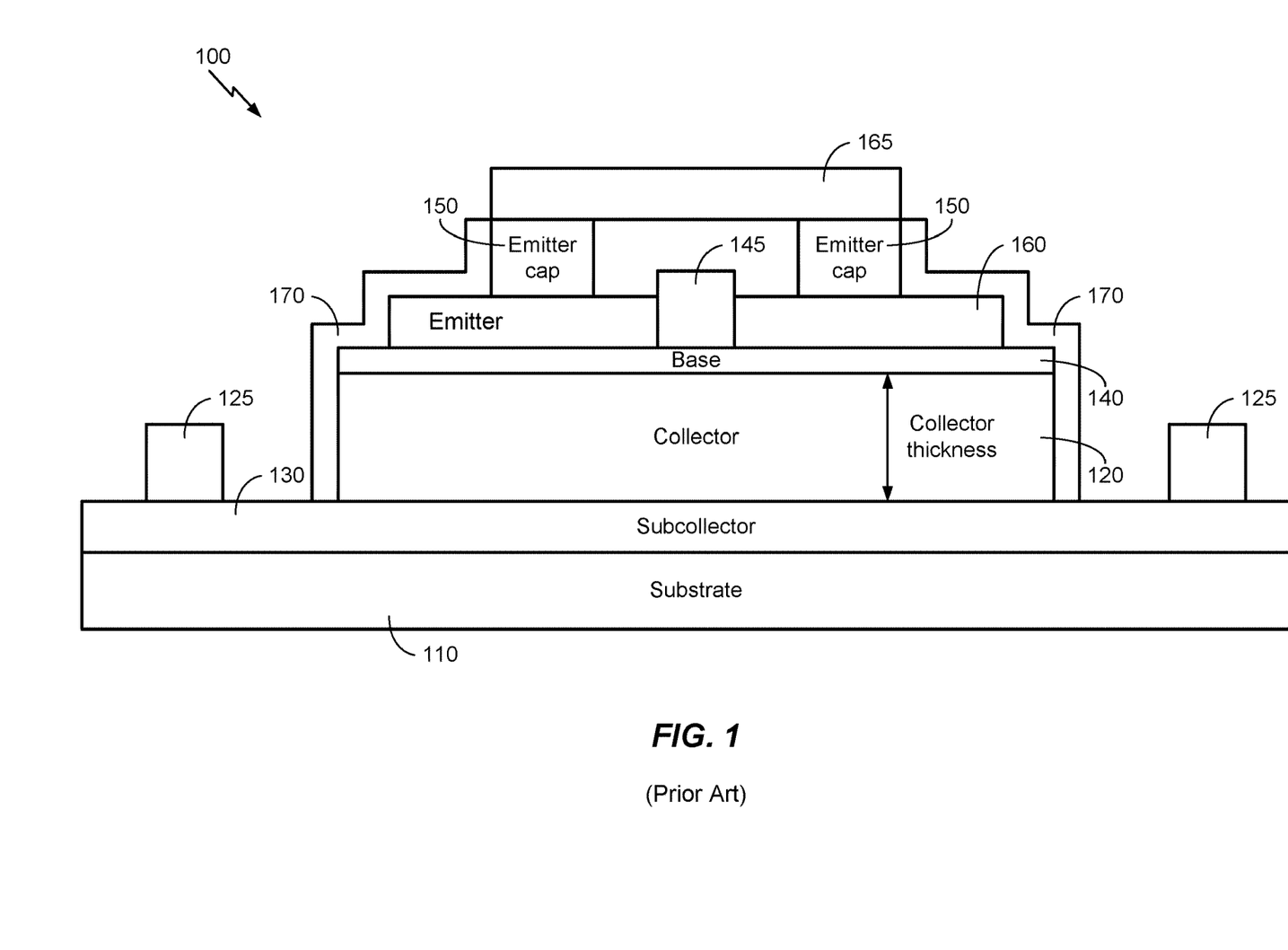
FIG. 1 illustrates a structure of a conventional heterojunction bipolar transistor.

FIG. 1 illustrates a structure of a conventional HBT 100. The HBT 100 includes a substrate 110, a subcollector 130 in contact with the substrate 110, a collector 120 in contact with the subcollector 130, a base 140 in contact with the collector 120, an emitter 160 in contact with the base 140, and two emitter caps 150 both in contact with the emitter 160. The substrate 110, the subcollector 130, the collector 120, the base 140, and emitter caps 150 for formed from GaAs and the emitters 160 are formed from AlGaAs. The HBT 100 is an NPN transistor in that the collector 120 is N doped, the base 140 is P doped, and the emitter 160 is N doped. Also, the base 140 and the emitter 160 are formed from different semiconductor layers types—GaAs vs AlGaAs. Therefore, the junction between the GaAs base 140 and the AlGaAs emitter 160 is a heterojunction, hence the name "heterojunction bipolar transistor".

The HBT 100 also includes a collector metal 125, a base metal 145, and emitter metals 165. The collector metal 125 is in contact with the subcollector 130, the base metal 145 is in contact with the base 140, and the emitter metals 165 are in contact with the emitter caps 150. So as to provide low ohmic contacts for the collector metal 125, the base metal 145, and the emitter metals 165, the subcollector 130, the base 140, and the emitter caps 150 are all heavily doped. That is, the subcollector 130 is N+ doped, the base 140 is P+ doped, and the emitter caps 150 are N+ doped. The collector 120 is electrically coupled to the collector metal 125 through the subcollector 130, the base 140 is electrically coupled to the base metal 145, and the emitter 160 is electrically coupled to the emitter metals 165 through the emitter caps 150. A passivation layer 170 is formed on the collector 120, the base 140, and the emitter 160.

In the conventional HBT 100, it is generally recognized that an increase in the thickness of the collector results in an increase in the breakdown voltage Vb. Thus, by increasing the collector thickness, the HBT 100 can be operated with higher power, which is desirable. However, the increased collector thickness also results in an increase in the carrier transient time z, which correspondingly reduces the frequency response, which is not desirable. According to equation (1), it is seen that with the conventional HBT 100, there is a tradeoff between achieving high power and high speed.

Figure 2:
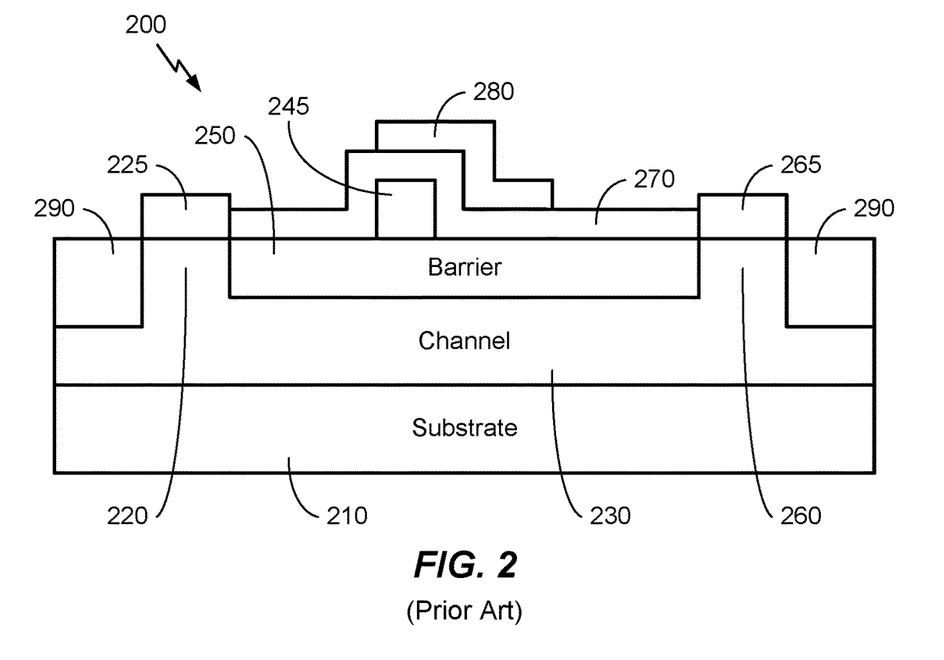
FIG. 2 illustrates an example of a field effect transistor or a high electron mobility transistor in which a field plate is utilized.

To address one or more issues associated with conventional HBTs, it is proposed to use field plates (FPs). FPs can reduce peak electric fields in semiconductor layers. FIG. 2 illustrates an example of a field effect transistor (FET) or a high electron mobility transistor (HEMT) 200 in which an FP is utilized. The FET 200 includes a sapphire substrate 210, a GaN channel 230, source and drain 220, 260 formed in the channel 230, and a barrier layer 250 in between the source and the drain 220, 260. Isolation layers 290 isolate the FET 200. The channel 230 is N doped, and the source and the drain 220, 260 are N+ doped. Source and drain electrodes 225, 265 are respectively in electrical contact with the source and the drain 220, 260. A gate electrode 245 is on the barrier layer 250, and a passivation layer 270 encapsulates the gate electrode 245. A field plate (FP) 280 is formed on the passivation layer 270 above the gate electrode 245. The FP 280 is coupled to either the gate electrode 245 or the source electrode 225.

Figure 3:
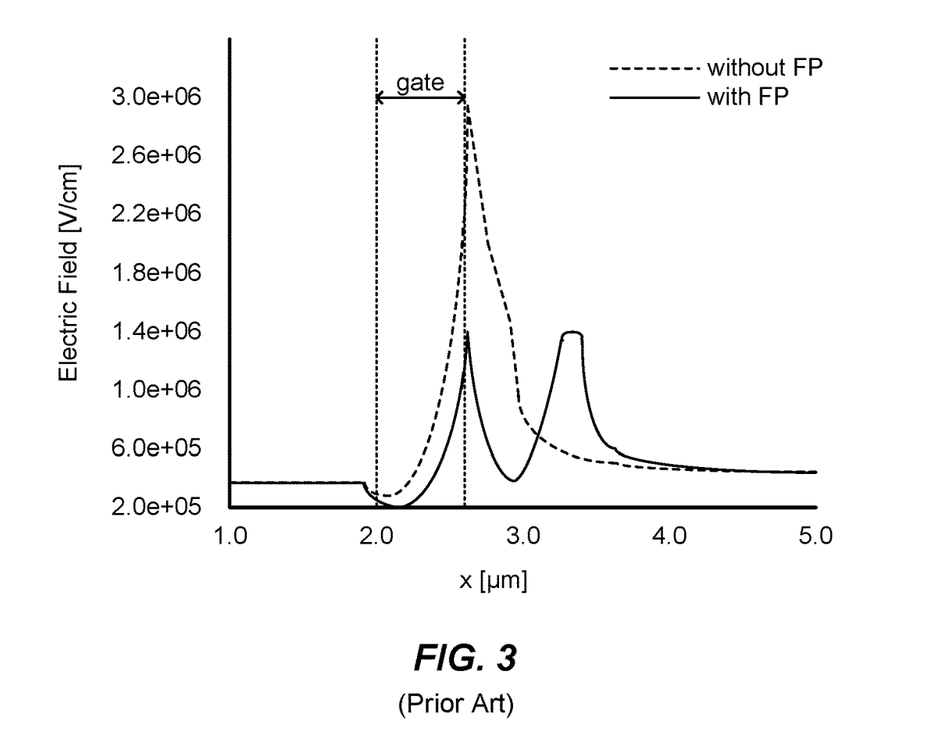
FIG. 3 illustrates an electric field along a channel of the field effect transistor or a high electron mobility transistor.

FIG. 3 illustrates an electric field along the channel of an FET such as the FET 200 illustrated in FIG. 2. Note that without the FP 280, the electric field in the channel 230 can be very intense, especially near the gate electrode 245. However, with the FP 280, the electric field intensity is significantly reduced. The peak electric field with the FP 280 is less than half the peak electric field without the FP 280. Also, the electric field within the channel 230 is more uniform with the FP 280.

Figure 4:
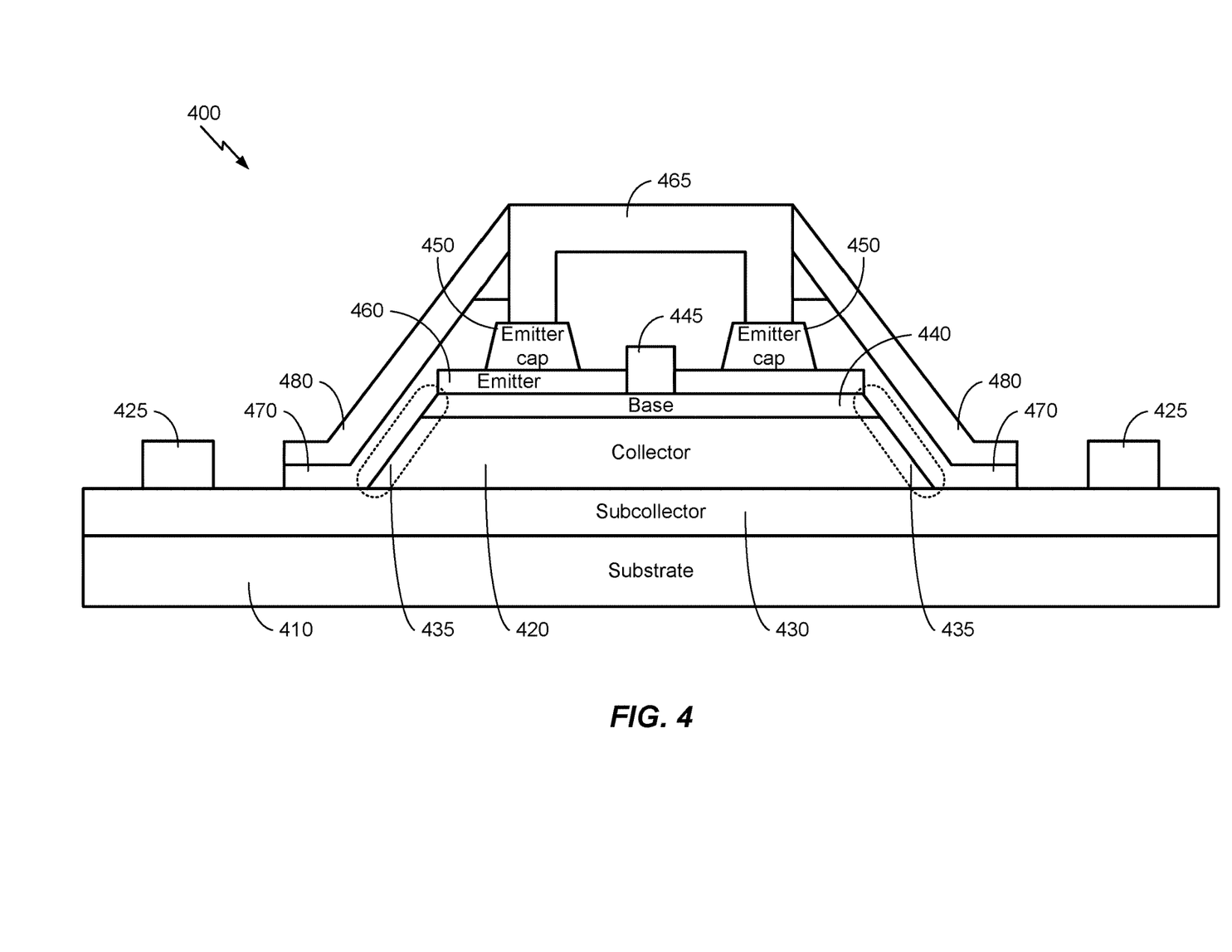
FIG. 4 illustrates a non-limiting example of a heterojunction bipolar transistor.

FIG. 4 illustrates an example of a heterojunction bipolar transistor (HBT) 400 that addresses one or more issues associated with conventional HBTs. The HBT 400 may include a collector 420, a base 440, and an emitter 460 stacked in that order from bottom to top. As implied in the name "HBT", the collector 420, the base 440, and the emitter 460 may be semiconductor layers of a bipolar transistor. As such, the base 440 may be in contact with an upper surface of the collector 420, and the emitter 460 may be in contact with an upper surface of the base 440. It is noted that while terms such as "upper", "lower", "left", "right", "top", "bottom", etc. are used in this disclosure, they should not be taken as defining absolute orientations. Rather, they should be taken simply as terms of convenience to indicate relative locations and orientations of the described components.

The HBT 400 may be an NPN or a PNP transistor. That is, the collector 420 and the emitter 460 may be doped with a first dopant type (one of N or P), and the base 440 may be doped with a second dopant type (the other of N or P). The base 440 may be heavily doped (e.g., P+ or N+ doped) while the collector 420 and the emitter 460 may not be as heavily doped (e.g., N or P doped).

Also as implied in the name "HBT", the semiconductor of the emitter 460 may be different from the semiconductor of the base 440. Typically, the semiconductors are chosen so that the bandgap energy of the emitter 460 is wider than that of the base 440. For example, the emitter 460 may be formed from semiconductor materials such as AlGaAs, InGaP, InP, etc. and the base 440 may be formed from semiconductor materials such as GaAs, InGaAs, etc. That is, emitter/base materials combinations can include AlGaAs/GaAs, InGaP/GaAs, InP/InGaAs, and so on. Other combinations include AlInAs/InGaAs, Si/SiGe, InAlAs/InGaAs, and so on. These are merely examples, and are not meant to be exhaustive. The collector 420 may be formed from same or similar semiconductor materials as that of the base 440.

The HBT 400 may include a substrate 410 and a subcollector 430 on the substrate 410. The substrate 410 may be an insulating or a semi-insulating semiconductor layer, and the subcollector 430 may be in contact with an upper surface of the substrate 410. The collector 420 may be in contact with an upper surface of the subcollector 430. The collector 420 and the subcollector 430 may be formed from same or similar semiconductor materials. For example, the collector 420 and the subcollector 430 may be formed from GaAs. The collector 420 and the subcollector 430 may be doped with the first dopant type, e.g., N (or P) dopant type for an NPN (or a PNP) HBT 400. However, the subcollector 430 may be doped much more heavily than the collector 420 (e.g., N+(or P+) doped for the subcollector 430 vs. N (or P) doped for the collector 420).

The HBT 400 may include one or more collector contacts 425 (two are illustrated in FIG. 4) electrically coupled to the collector 420. The collector contacts 425 may be formed from highly conductive materials such as metal. The collector contacts 425 may be in contact with (e.g., the upper surface of) the subcollector 430. As such, each collector contact 425 may be electrically coupled to the collector 420 through the subcollector 430. It is indicated above that the subcollector 430 may be heavily doped (N+ or P+). The dopant level in the subcollector 430 may be sufficient to provide low resistance ohmic contacts with the collector contacts 425.

The HBT 400 may include one or more base contacts 445 (one is illustrated in FIG. 4) electrically coupled to the base 440. The base contacts 445 may be formed from highly conductive materials such as metal. The base contacts 445 may be in contact with (e.g., the upper surface of) the base 440. Recall that the base 440 may be heavily doped with the second dopant type (e.g., P+(or N+) doped for an NPN (or a PNP) HBT 400). The dopant level in the base 440 may be sufficient to provide low resistance ohmic contacts with the base contacts 445.

The HBT 400 may include one or more emitter caps 450 (two are illustrated in FIG. 4) on the emitter 460 and one or more emitter contacts 465 (one is illustrated in FIG. 4) on the emitter caps 450 such that the emitter contacts 465 are electrically coupled to the emitter 460 through the emitter caps 450. The emitter caps 450 may be in contact with (e.g., the upper surface of) the emitter 460, and the emitter contacts 465 may be in contact with (e.g., the upper surfaces of) the emitter caps 450.

The emitter 460 and the emitter caps 450 may be doped with the first dopant type, e.g., N (or P) dopant type for an NPN (or a PNP) HBT 400. However, the emitter caps 450 may be doped much more heavily than the emitter 460 (e.g., N+(or P+) doped for the emitter caps 450 vs. N (or P) doped for the emitter 460). The dopant level in the emitter caps 450 may be sufficient to provide low resistance ohmic contacts with the emitter contacts 465.

The HBT 400 may include one or more passivation layers 470 on one or more mesa surfaces 435. In FIG. 4, two mesa surfaces 435, which are sloped surfaces, are highlighted with dashed ovals. Each mesa surface 435 may be defined by side surfaces of the collector 420 and the base 440 on the same side. The side surfaces of the collector 420 and the base 440 on the same side may be continuous such that the mesa surface 435 is planar. For example, a first (e.g., left) mesa surface 435 may be defined by first (e.g., left) side surfaces of the collector 420 and the base 440. The first side surfaces of the collector 420 and the base 440 may be continuous such that the first mesa surface 435 is planar. Alternatively or in addition thereto, a second (e.g., right) mesa surface 435 may be defined by second (e.g., right) side surfaces of the collector 420 and the base 440. The second side surfaces of the collector 420 and the base 440 may be continuous such that the second mesa surface 435 is planar.

Each mesa surface 435 may be defined by entire side surfaces of the collector 420 and the base 440 on the same side, i.e., from the upper surface of the base 440 to the lower surface of the collector 420. For example, the first mesa surface 435 may be defined by the entire first side surface of the base 440 and the entire first side surface of the collector 420, from the upper surface of the base 440 to the lower surface of the collector 420. The second mesa surface 435 may be defined by the entire second side surface of the base 440 and the entire second side surface of the collector 420, from the upper surface from the upper surface of the base 440 to the lower surface of the collector 420.

Inner surfaces of the passivation layers 470 may contact the corresponding mesa surfaces 435. For example, the inner surface of the first (e.g., left) passivation layer 470 may be in contact with the first mesa surface 435, and the inner surface of the second (e.g., right) passivation layer 470 may be in contact with the second mesa surface 435. The passivation layers 470 may be formed from dielectric materials such as SiN.

FIG. 4 illustrates two passivation layers 470 on both mesa surfaces 435. However, it is not necessary that the passivation layers 470 be formed on all mesa surfaces 435. For example, the left passivation layer 470 may be formed on the left mesa surface 435 without the right passivation layer 470 being formed. In another example, the right passivation layer 470 may be formed on the right mesa surface 435 without the left passivation layer 470 being formed. In short, for each mesa surface 435, there may or may not be a passivation layer 470 formed there on.

The passivation layers 470 may also be formed on the emitter 460 and/or the emitter caps 450 and/or the emitter contacts 465. For example, FIG. 4 illustrates that the passivation layers 470 may be in contact with the emitter 460

(e.g., on side and/or top surfaces), the emitter caps 450 (e.g., on side and/or top surfaces), and/or the emitter contact 465.

The HBT 400 may include one or more field plates 480 on the one or more passivation layers 470 such that each passivation layer 470 is in between a corresponding mesa surface 435 and a corresponding field plate 480. FIG. 4 illustrates first and second field plates 480 such that the first passivation layer 470 is in between the first mesa surface 435 and the first field plate 480, and the second passivation layer 470 is in between the second mesa surface 435 and the second field plate 480. The field plates 480 may be examples of means for attenuating collector electric fields, and may be formed from electrically conductive materials such as metals and very highly doped semiconductors.

Outer surfaces of the passivation layers 470 may contact the corresponding field plates 480. For example, the outer surface of the first passivation layer 470 may be in contact with an inner surface of the first field plate 480, and the outer surface of the second passivation layer 470 may be in contact with an inner surface of the second field plate 480.

FIG. 4 illustrates two field plates 480 corresponding to both mesa surfaces 435. However, it is not necessary that the field plates 480 be formed corresponding to all mesa surfaces 435. For example, the left field plate 480 corresponding to the left mesa surface 435 may be formed without the right field plate 480 being formed. In another example, the field plate 480 may be without the left field plate 480 being formed. In short, for each mesa surface 435, a corresponding field plate 480 may or may not be formed.

The field plates 480 may be electrically coupled to the emitter 460. One (of several) ways to couple the field plates 480 to the emitter 460 is through the one or more emitter contacts 465. For example, FIG. 4 illustrates that the field plates 480 may be in contact with the emitter contact 465. Alternatively, the field plates 480 may be integrally formed with the emitter contact 465 from a same material, e.g., a metal.

While two field plates 480 are illustrated, there can be any number—i.e., one or more—of field plates 480. Also while one emitter contact 465 is illustrated, there can be any number—i.e., one or more—of emitter contacts 465. For each field plate 480 electrically coupled to the emitter 460, that field plate 480 may be electrically coupled to the emitter 460 through at least one emitter contact 465. For example, for each field plate 480 electrically coupled to the emitter 460, that field plate 480 may be in contact with at least one emitter contact 465 or may be integral with the at least one emitter contact 465.

Further, there are no strict requirements dictating correspondences between the field plates 480 and the emitter contacts 465. For example, between any two field plates 480, one field plate 480 may be coupled to the emitter 460 through at least one emitter contact 465 (e.g., in contact with or integral with), and the other field plate 480 may be coupled to the emitter 460 through the same at least one emitter contact 465 (e.g., in contact with or integral with), or through a different at least one emitter contact 465 (e.g., in contact or integrally formed).

The field plates 480 electrically coupled to the emitter 460 can significantly reduce the peak electric field intensity in the collector 420. Also, the field plates 480 can enhance uniformity of the electric field within the collector 420. By reducing the electric field intensity in the collector 420 with the field plates 480, the breakdown voltage Vb of the HBT 400 can be increased while keeping collector 420 relatively thin. This means that both higher power and fast frequency response are possible in one HBT.

The desirable effects of the field plates 480 can be enhanced geometrically. As seen in FIG. 4, the collector 420 may have a trapezoidal shape such that its lower surface is wider than its upper surface. The base 440 may also have a trapezoidal shape such that its lower surface is wider than its upper surface. Further, a width of the upper surface of the collector 420 may be equal to a width of the lower surface of the base 440. In this way, the mesa surfaces 435, defined by the side surfaces of the collector 420 and the base 440 can be continuous. For example, the mesa surfaces 435 may be planar.

As a result, the mesa surfaces 435 can be sloped such that there are non-zero deviation angles between the mesa surfaces 435 and a direction normal to a plane defined by the lower surface of the collector 420. FIG. 4 illustrates both mesa surfaces 435 as being sloped to have non-zero deviation angles. However, this is not a requirement. That is, while it may be preferred, it is not required that all mesa surfaces 435 be sloped to have non-zero deviation angles. It should also be noted that the deviation angles need not be the same for all mesa surfaces 435.

FIG. 4 illustrates that both field plates 480 are sloped in parallel with the mesa surfaces 435. When the field plates 480 are sloped in parallel with the corresponding mesa surfaces 435, the electric field within the collector 420 can be made even more uniform. To enhance the likelihood of having parallel field plates 480 and mesa surfaces 435, each passivation layer 470 can be formed to have a uniform thickness at least along the corresponding mesa surface 435. While it may be preferred, it is not necessary for all field plates 480 be parallel with the slops of the corresponding mesa surfaces 435.

Figure 5:
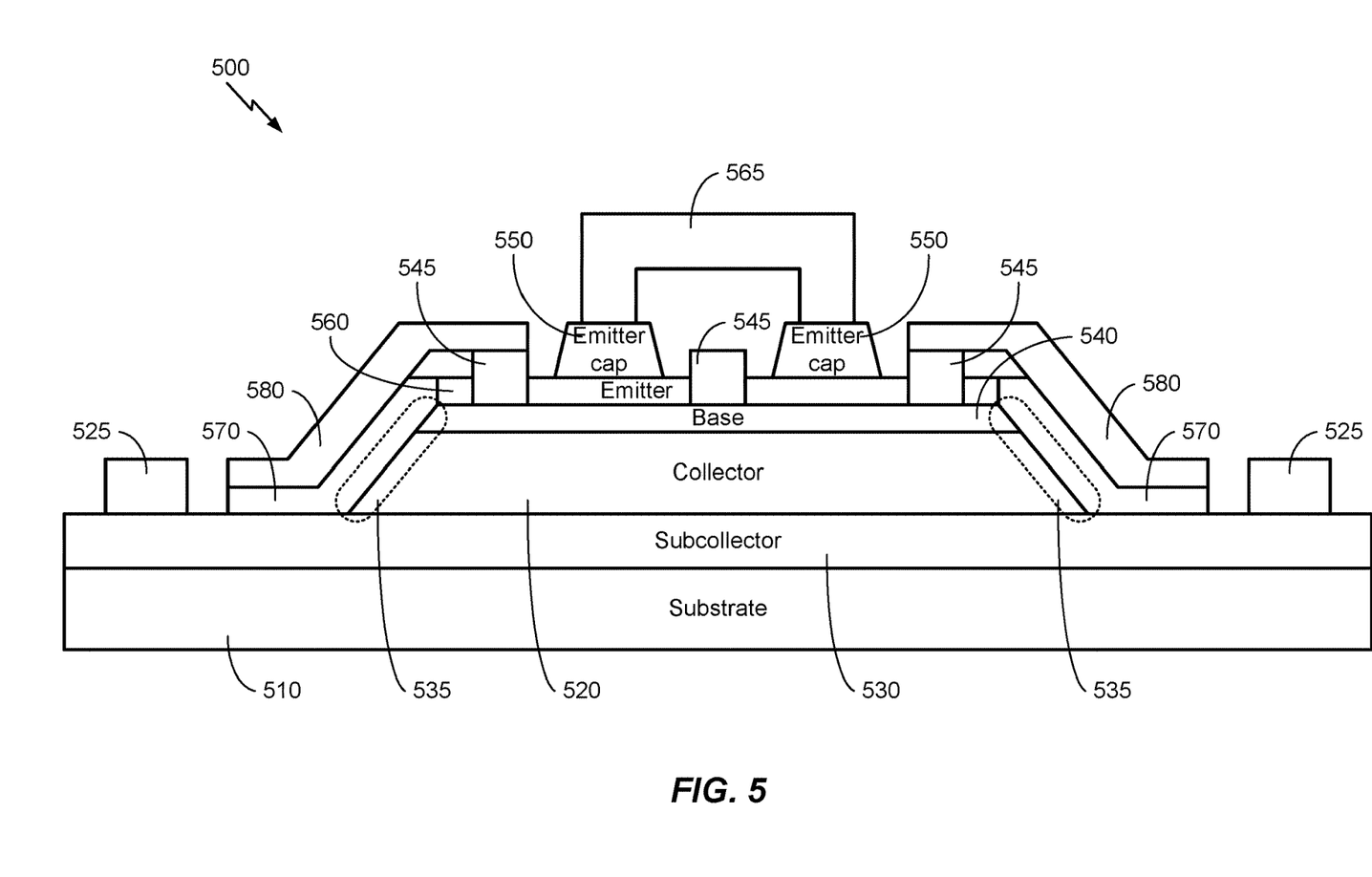
FIG. 5 illustrates another non-limiting example of a heterojunction bipolar transistor.

FIG. 5 illustrates an example of a different HBT 500 that also addresses one or more issues associated with conventional HBTs. Many of the components that make up the HBT 500 are similar to the components that make up the HBT 400 of FIG. 4. For example, the HBT 500 may include a substrate 510, a subcollector 530, a collector 520, a base 540, and an emitter 560 stacked in that order from bottom to top. The HBT 500 may also include one or more collector contacts 525 (two are illustrated in FIG. 5), one or more base contacts 545 (three are illustrated in FIG. 5), one or more emitter caps 550 (two are illustrated in FIG. 5), and one or more emitter contacts 565 (one is illustrated in FIG. 5). Due to their similarities with the components of the HBT 400, individual detailed descriptions of these components of the HBT 500 will be omitted.

The HBT 500 may also include one or more passivation layers 570 (two are illustrated in FIG. 5) and one or more field plates 580 (two are illustrated in FIG. 5). These are similar to the passivation layers 470 and the field plates 480 of the HBT 400. But they are also different in other ways. One of the significant differences is the following. FIG. 4 illustrates that the field plates 480 may be electrically coupled to the emitter 460. On the other hand, FIG. 5 illustrates that the field plates 580 may be electrically coupled to the base 540.

In detail, the one or more passivation layers 570 may be on one or more mesa surfaces 535. In FIG. 5, two mesa surfaces 535 are highlighted with dashed ovals. Each mesa surface 535 may be defined by side surfaces of the collector 520 and the base 540 on the same side. For example, a first (e.g., left) mesa surface 535 may be defined by first (e.g., left) side surfaces of the collector 520 and the base 540, and a second (e.g., right) mesa surface 535 may be defined by second (e.g., right) side surfaces of the collector 520 and the base 540. Each mesa surface 535 may be defined by entire side surfaces of the collector 520 and the base 540 on the same side, i.e., from the upper surface of the base 540 to the lower surface of the collector 520.

Inner surfaces of the passivation layers 570 may contact the corresponding mesa surfaces 535. For example, the inner surface of the first (e.g., left) passivation layer 570 may be in contact with the first mesa surface 535, and the inner surface of the second (e.g., right) passivation layer 570 may be in contact with the second mesa surface 535. The passivation layers 570 may be formed from dielectric materials such as SiN. While not specifically shown, it is not necessary that the passivation layers 570 be formed on all mesa surfaces 535. The passivation layers 570 may also be formed on the emitter 560. For example, FIG. 5 illustrates that the passivation layers 570 may be in contact with the emitter 560.

The one or more field plates 580 may be on the one or more passivation layers 570 such that each passivation layer 570 is in between a corresponding mesa surface 535 and a corresponding field plate 580. Outer surfaces of the passivation layers 570 may contact the corresponding field plates 580. While not specifically shown, it is not necessary that the field plates 580 be formed corresponding to all mesa surfaces 535.

The field plates 580 may be electrically coupled to the emitter 560. One (of several) ways to couple the field plates 580 to the emitter 560 is through the one or more base contacts 545. For example, FIG. 5 illustrates that the field plates 580 may be in contact with the base contacts 545. Alternatively, the field plates 580 may be integrally formed with the base contacts 545 from a same material, e.g., a metal.

While two field plates 580 are illustrated, there can be any number—i.e., one or more—of field plates 580. Also while three base contacts 545 are illustrated, there can be any number—i.e., one or more—of base contacts 545. For each field plate 580 electrically coupled to the base 540, that field plate 580 may be electrically coupled to the base 540 through at least one base contact 545. For example, for each field plate 580 electrically coupled to the base 540, that field plate 580 may be in contact with at least one base contact 545 or may be integral with the at least one base contact 545.

Further, there are no strict requirements dictating correspondences between the field plates 580 and the base contacts 545. For example, between any two field plates 580, one field plate 580 may be coupled to the base 540 through at least one base contact 545 (e.g., in contact with or integral with), and the other field plate 580 may be coupled to the base 540 through the same at least one base contact 545 (e.g., in contact with or integral with), or through a different at least one base contact 545 (e.g., in contact or integrally formed).

The field plates 580 electrically coupled to the base 540 can significantly reduce the peak electric field intensity in the collector 520. Also, the field plates 580 can enhance uniformity of the electric field within the collector 520. By reducing the electric field intensity in the collector 520 with the field plates 580, the breakdown voltage Vb of the HBT 500 can be increased while keeping collector 520 relatively thin. This means that both higher power and fast frequency response are possible in one HBT.

The desirable effects of the field plates 580 can be enhanced geometrically. Similar to the HBT 400, the collector 520 and the base 440 may have trapezoidal shapes such that the mesa surfaces 535, defined by the side surfaces of the collector 520 and the base 540 can be planar. Also, the resultant mesa surfaces 535 can be sloped such that there are non-zero deviation angles between the mesa surfaces 535 and a direction normal to a plane defined by the lower surface of the collector 520. Further, field plates 580 may be sloped in parallel with the mesa surfaces 535. While it may be preferred, it is not required that all mesa surfaces 535 be sloped to have non-zero deviation angles. Also, the deviation angles need not be the same for all mesa surfaces 535.

Figure 6:
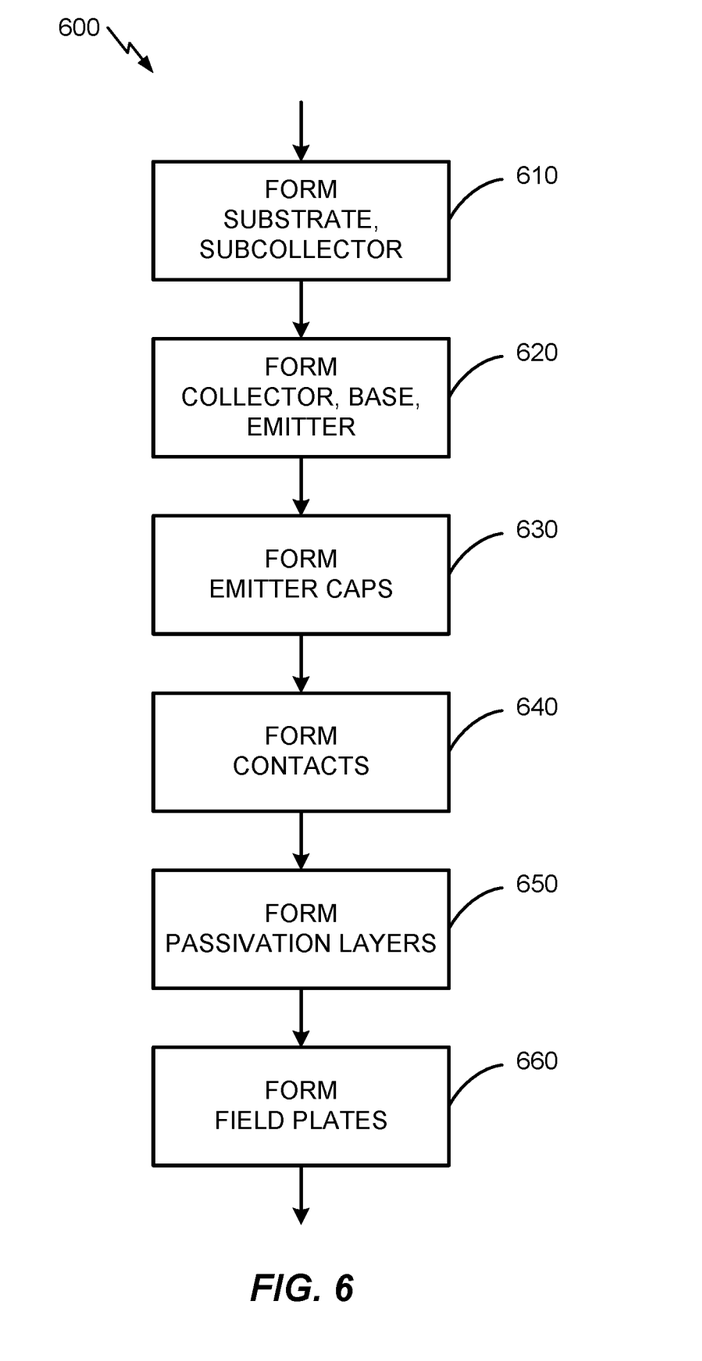
FIG. 6 illustrates a flow chart of a non-limiting example method to fabricate a heterojunction bipolar transistor.

FIG. 6 illustrates a flow chart of a non-limiting method 600 to fabricate an HBT such as the HBT 400, 500. It should be noted that not all illustrated blocks of FIG. 6 need to be performed, i.e., some blocks may be optional. Also, the numerical references to the blocks in FIG. 6 should not be taken as requiring that the blocks should be performed in a certain order. Indeed, some blocks may be performed concurrently.

In block 610, the substrate 410, 510 may be formed and the subcollector 430, 530 may be formed on the substrate 410, 510. In block 620, the collector 420, 520 may be formed on the subcollector 430, 530, the base 440, 540 may be formed on the collector 420, 520, and the emitter 460, 560 may be formed on the base 440, 540. In block 630, the emitter caps 450, 550 may be formed on the emitter.

In block 640, the contacts may be formed. That is, the collector contacts 425, 525 may be formed electrically coupled to the collector 420, 520, the base contacts 445, 545 may be formed electrically coupled to the base 440, 540, and emitter contacts 465, 565 may be formed electrically coupled to the emitter 460, 560.

In block 650, the passivation layers 470, 570 may be formed on the mesa surfaces 435, 535. In block 660, the field plates 480, 580 may be formed. The field plates 480 may be formed to electrically couple to the emitter 460. Alternatively, or in addition thereto, the field plates 580 may be formed to electrically couple to the base 540.

Figure 7:
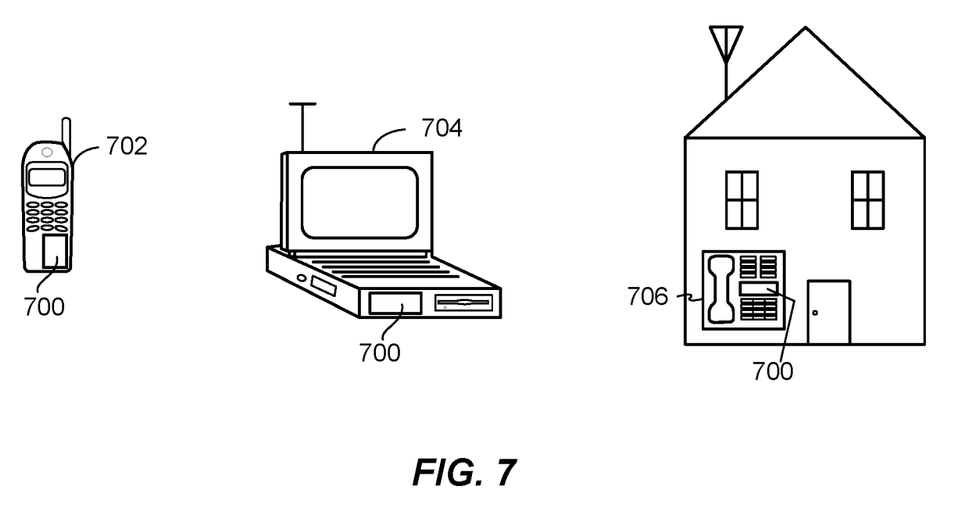
FIG. 7 illustrates non-limiting examples of devices with heterojunction bipolar transistors with field plates integrated therein.

FIG. 7 illustrates various electronic devices that may be integrated with the aforementioned HBTs illustrated in FIGS. 4 and 5. For example, a mobile phone device 702, a laptop computer device 704, a terminal device 706 as well as wearable devices, portable systems, that require small form factor, extreme low profile, may include an apparatus 700 that incorporates the devices/systems as described herein. The apparatus 700 may be, for example, any of the integrated circuits, dies, integrated devices, integrated device packages, integrated circuit devices, device packages, integrated circuit (IC) packages, package-on-package devices, system-in-package devices described herein. The devices 702, 704, 706 illustrated in FIG. 7 are merely exemplary. Other electronic devices may also feature the apparatus 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the examples disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled with the processor such that the processor can read information from, and write information to, the storage medium. In the alternative, the storage medium may be integral to the processor.

Accordingly, an aspect can include a computer-readable media embodying any of the devices described above. Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, processes and/or actions of the method claims in accordance with the examples described herein need not be performed in any particular order. Furthermore, although elements of the disclosed subject matter may be described or claimed in the singular, the plural is contemplated unless limitation to the singular is explicitly stated.

What is claimed is:

1. A heterojunction bipolar transistor, comprising:
    a collector;
    a base in contact with an upper surface of the collector;
    an emitter in contact with an upper surface of the base;
    one or more passivation layers on one or more mesa surfaces, each mesa surface being defined by side surfaces of the collector and the base on a same side from the upper surface of the base to a lower surface of the collector; and
    one or more field plates on the one or more passivation layers such that each passivation layer is in between a corresponding mesa surface and a corresponding field plate,
    wherein each field plate is electrically coupled to one of the emitter or the base, and
    wherein each mesa surface is sloped such that there is a non-zero deviation angle between that mesa surface and a direction normal to a plane defined by the lower surface of the collector.

2. The heterojunction bipolar transistor of claim 1, wherein the one or more field plates are sloped in parallel with the corresponding one or more mesa surfaces.

3. The heterojunction bipolar transistor of claim 1, further comprising:
    one or more collector contacts electrically coupled to the collector;
    one or more base contacts electrically coupled to the base;
    one or more emitter contacts electrically coupled to the emitter,
    wherein for each field plate electrically coupled to the emitter, that field plate is electrically coupled to the emitter through at least one emitter contact, and
    wherein for each field plate electrically coupled to the base, that field plate is electrically coupled to the base through at least one base contact.

4. The heterojunction bipolar transistor of claim 3, further comprising:
    a substrate;
    a subcollector in contact with an upper surface of the substrate, wherein the one or more collector contacts are electrically coupled to the collector through the subcollector; and
    one or more emitter caps in contact with the emitter, wherein the one or more emitter contacts are electrically coupled to the emitter through the one or more emitter caps.

5. The heterojunction bipolar transistor of claim 4,
    wherein the collector is in contact with an upper surface of the subcollector, and the one or more collector contacts are in contact with the upper surface of the subcollector,
    wherein the one or more base contacts are in contact with the upper surface of the base, and
    wherein the one or more emitter caps are in contact with an upper surface of the emitter, and the one or more emitter contacts are in contact with upper surfaces of the one or more emitter caps.

6. The heterojunction bipolar transistor of claim 5,
    wherein the collector and the subcollector are doped with a first dopant type,
    wherein a dopant level of the subcollector is greater than a dopant level of the collector and is sufficient to provide low resistance ohmic contacts with the one or more collector contacts,
    wherein the base is doped with a second dopant type opposite the first dopant type,
    wherein a dopant level of the base is sufficient to provide low resistance ohmic contacts with the one or more base contacts,
    wherein the emitter and the one or more emitter caps are doped with the first dopant type, and
    wherein dopant levels of the one or more emitter caps are greater than a dopant level of the emitter and are sufficient to provide low resistance ohmic contacts with the one or more emitter contacts.

7. The heterojunction bipolar transistor of claim 3,
    wherein for each field plate electrically coupled to the emitter, that field plate is in contact or is integral with the at least one emitter contact, and
    wherein for each field plate electrically coupled to the base, that field plate is in contact or is integral with the at least one base contact.

8. The heterojunction bipolar transistor of claim 1, wherein an inner surface of each passivation layer is in contact with the corresponding mesa surface and an outer surface of each passivation layer is in contact with the corresponding field plate.

9. The heterojunction bipolar transistor of claim 1,
wherein the one or more passivation layers comprise first and second passivation layers respectively on first and second mesa surfaces, the first mesa surface being defined by first side surfaces of the collector and the base from the upper surface of the base to the lower surface of the collector, and the second mesa surface being defined by second side surfaces of the collector and the base from the upper surface of the base to the lower surface of the collector,
wherein the one or more field plates comprise first and second field plates respectively on the first and second passivation layers such that the first passivation layer is in between the first mesa surface and first field plate, and the second passivation layer is in between the second mesa surface and the second field plate,
wherein the first field plate is electrically coupled to one of the emitter or the base, and
wherein the second field plate is electrically coupled to one of the emitter or the base.

10. The heterojunction bipolar transistor of claim 9, further comprising:
one or more collector contacts electrically coupled to the collector;
one or more base contacts electrically coupled to the base;
one or more emitter contacts electrically coupled to the emitter,
wherein the first field plate is electrically coupled to the emitter through at least one emitter contact or is electrically coupled to the base through at least one base contact, and
wherein the second field plate is electrically coupled to the emitter through a same or a different at least one emitter contact or is electrically coupled to the base through a same or a different at least one base contact.

11. The heterojunction bipolar transistor of claim 10, further comprising:
a substrate;
a subcollector in contact with an upper surface of the substrate; and
one or more emitter caps in contact with an upper surface of the emitter,
wherein the collector and the one or more collector contacts are in contact with an upper surface of the subcollector,
wherein the one or more base contacts are in contact with the upper surface of the base,
wherein the one or more emitter contacts are in contact with upper surfaces of the one or more emitter caps,
wherein the first field plate is in contact or is integral with the at least one emitter contact or is in contact or is integral with the at least one base contact, and
wherein the second field plate is in contact or is integral with the same or the different at least one emitter contact or is in contact or is integral with the same or the different at least one base contact.

12. The heterojunction bipolar transistor of claim 1, wherein the one or more field plates are formed from metal.

13. A method of forming a heterojunction bipolar transistor, comprising:
forming a collector;
forming a base in contact with an upper surface of the collector;
forming an emitter in contact with an upper surface of the base;
forming one or more passivation layers on one or more mesa surfaces, each mesa surface being defined by side surfaces of the collector and the base on a same side from the upper surface of the base to a lower surface of the collector;
forming one or more field plates on the one or more passivation layers such that each passivation layer is in between a corresponding mesa surface and a corresponding field plate,
wherein the each field plate is formed to electrically couple to one of the emitter or the base, and
wherein each mesa surface is sloped such that a non-perpendicular angle is formed between that mesa surface and a plane defined by the lower surface of the collector.

14. The method of claim 13, wherein the one or more passivation layers are formed with slopes in parallel with the slopes of the corresponding one or more mesa surfaces.

15. The method of claim 13, further comprising:
forming one or more collector contacts electrically coupled to the collector;
forming one or more base contacts electrically coupled to the base;
forming one or more emitter contacts electrically coupled to the emitter,
wherein for each field plate electrically coupled to the emitter, that field plate is formed to electrically couple to the emitter through at least one emitter contact, and
wherein for each field plate electrically coupled to the base, that field plate is formed to electrically couple to the base through at least one base contact.

16. The method of claim 15, further comprising:
forming a substrate;
forming a subcollector in contact with an upper surface of the substrate, wherein the one or more collector contacts are formed to electrically couple to the collector through the subcollector; and
forming one or more emitter caps in contact with the emitter, wherein the one or more emitter contacts are formed to electrically couple to the emitter through the one or more emitter caps.

17. The method of claim 16,
wherein the collector is formed in contact with an upper surface of the subcollector, and the one or more collector contacts are formed in contact with the upper surface of the subcollector,
wherein the one or more base contacts are formed in contact with the upper surface of the base, and
wherein the one or more emitter caps are formed in contact with an upper surface of the emitter, and the one or more emitter contacts are in contact with upper surfaces of the one or more emitter caps.

18. The method of claim 17, further comprising:
doping the collector with a first dopant type;
doping the subcollector with the first dopant type such that a dopant level of the subcollector is greater than a dopant level of the collector and is sufficient to provide low resistance ohmic contacts with the one or more collector contacts;
doping the base with a second dopant type opposite the first dopant type such that a dopant level of the base is sufficient to provide low resistance ohmic contacts with the one or more base contacts;
doping the emitter with the first dopant type; and doping the one or more emitter caps with the first dopant type such that dopant levels of the one or more emitter caps are greater than a dopant level of the emitter and are sufficient to provide low resistance ohmic contacts with the one or more emitter contacts.

19. The method of claim 15,
wherein for each field plate electrically coupled to the emitter, that field plate is formed in contact or is formed integral with the at least one emitter contact, and
wherein for each field plate electrically coupled to the base, that field plate is formed in contact or is formed integral with the at least one base contact.

20. The method of claim 13, wherein the one or more passivation layers are formed such that an inner surface of each passivation layer is in contact with the corresponding mesa surface and outer surface of each passivation layer is in contact with the corresponding field plate.

21. The method of claim 13,
wherein forming the one or more passivation layers comprise forming first and second passivation layers respectively on first and second mesa surfaces, the first mesa surface being defined by first side surfaces of the collector and the base from the upper surface of the base to the lower surface of the collector, and the second mesa surface being defined by second side surfaces of the collector and the base from the upper surface of the base to the lower surface of the collector,
wherein forming the one or more field plates comprise forming first and second field plates respectively on the first and second passivation layers such that the first passivation layer is in between the first mesa surface and first field plate, and the second passivation layer is in between the second mesa surface and the second field plate,
wherein the first field plate is formed to electrically couple to one of the emitter or the base, and
wherein the second field plate is formed to electrically couple to one of the emitter or the base.

22. The method of claim 21, further comprising:
forming one or more collector contacts electrically coupled to the collector;
forming one or more base contacts electrically coupled to the base;
forming one or more emitter contacts electrically coupled to the emitter,
wherein the first field plate is formed to electrically couple to the emitter through at least one emitter contact or is formed to electrically couple to the base through at least one base contact, and
wherein the second field plate is formed to electrically couple to the emitter through a same or a different at least one emitter contact or is formed to electrically couple to the base through a same or a different at least one base contact.

23. The method of claim 22, further comprising:
forming a substrate;
forming a subcollector in contact with an upper surface of the substrate; and
forming one or more emitter caps in contact with an upper surface of the emitter,
wherein the collector and the one or more collector contacts are formed in contact with an upper surface of the subcollector,
wherein the one or more base contacts are formed in contact with the upper surface of the base,
wherein the one or more emitter contacts are formed in contact with upper surfaces of the emitter caps,
wherein the first field plate is formed in contact or is formed integral with the at least one emitter contact or is formed in contact or is formed integral with the at least one base contact, and
wherein the second field plate is formed in contact or is formed integral with the same or the different at least one emitter contact or is formed in contact or is formed integral with the same or the different at least one base contact.

24. The method of claim 13, wherein forming the one or more field plates comprises forming the one or more field plates from metal.

25. A heterojunction bipolar transistor, comprising:
a collector;
a base in contact with an upper surface of the collector;
an emitter in contact with an upper surface of the base;
one or more passivation layers on one or more mesa surfaces, each mesa surface being defined by side surfaces of the collector and the base on a same side from the upper surface of the base to a lower surface of the collector; and
one or more means for attenuating electric field on the one or more passivation layers such that each passivation layer is in between a corresponding mesa surface and a corresponding means for attenuating electric field,
wherein each means for attenuating electric field is electrically coupled to one of the emitter or the base, and
wherein each mesa surface is sloped such that a non-perpendicular angle is formed between that mesa surface and a plane defined by the lower surface of the collector.

* * * * *